United States Patent
Chou et al.

(10) Patent No.: US 9,338,900 B2
(45) Date of Patent: May 10, 2016

(54) INTERPOSER SUBSTRATE AND METHOD OF FABRICATING THE SAME

(71) Applicant: PHOENIX PIONEER TECHNOLOGY CO., LTD., Hukou Township (TW)

(72) Inventors: Pao-Hung Chou, Hukou Township (TW); Shih-Ping Hsu, Hukou Township (TW); Che-Wei Hsu, Hukuo Township (TW)

(73) Assignee: Phoenix Pioneer Technology Co., Ltd., Hukou Township, Hsinchu County (TW)

( * ) Notice: Subject to any disclaimer, the term of this patent is extended or adjusted under 35 U.S.C. 154(b) by 0 days.

(21) Appl. No.: 14/541,688

(22) Filed: Nov. 14, 2014

(65) Prior Publication Data

US 2016/0073516 A1    Mar. 10, 2016

(30) Foreign Application Priority Data

Sep. 10, 2014 (TW) .............................. 103131118 A

(51) Int. Cl.
*H01L 23/498* (2006.01)
*H05K 3/46* (2006.01)
*H01L 21/48* (2006.01)

(52) U.S. Cl.
CPC ................ *H05K 3/46* (2013.01); *H01L 21/486* (2013.01); *H01L 21/4846* (2013.01); *H01L 21/4853* (2013.01); *H01L 23/498* (2013.01); *H01L 23/49811* (2013.01); *H01L 23/49827* (2013.01); *H01L 23/49838* (2013.01); *H01L 23/49894* (2013.01)

(58) Field of Classification Search
CPC ..................... H01L 23/49811; H01L 23/49827
See application file for complete search history.

(56) References Cited

U.S. PATENT DOCUMENTS

2015/0262928 A1* 9/2015 Shen ...................... H01L 23/315
257/676

* cited by examiner

*Primary Examiner* — Daniel Shook
(74) *Attorney, Agent, or Firm* — Steptoe & Johnson LLP

(57) ABSTRACT

A method of fabricating an interposer substrate is provided, including: providing a carrier having a first wiring layer and a plurality of conductive pillars disposed on the first wiring layer; forming a first insulating layer on the carrier, with the conductive pillars being exposed from the first insulating layer; forming a second wiring layer on the first insulating layer and the conductive pillars; disposing a plurality of external connection pillars on the second wiring layer; forming a second insulating layer on the first insulating layer, with the external connection pillars being exposed from the second insulating layer; forming at least a trench on the second insulating layer; and removing the carrier. Through the formation of the interposer substrate, which does not have a core layer, on the carrier, a via process is omitted. Therefore, the method is simple, and the interposer substrate thus fabricated has a low cost. The present invention further provides the interposer substrate.

13 Claims, 11 Drawing Sheets

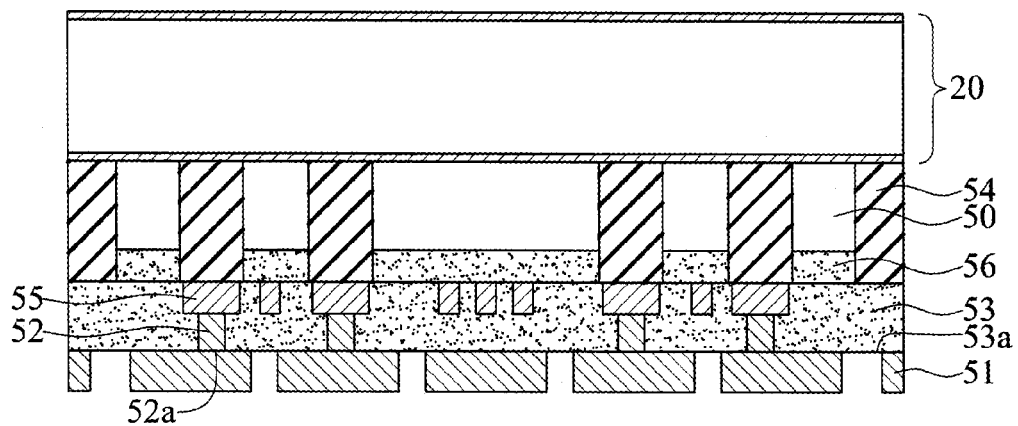
FIG. 5D
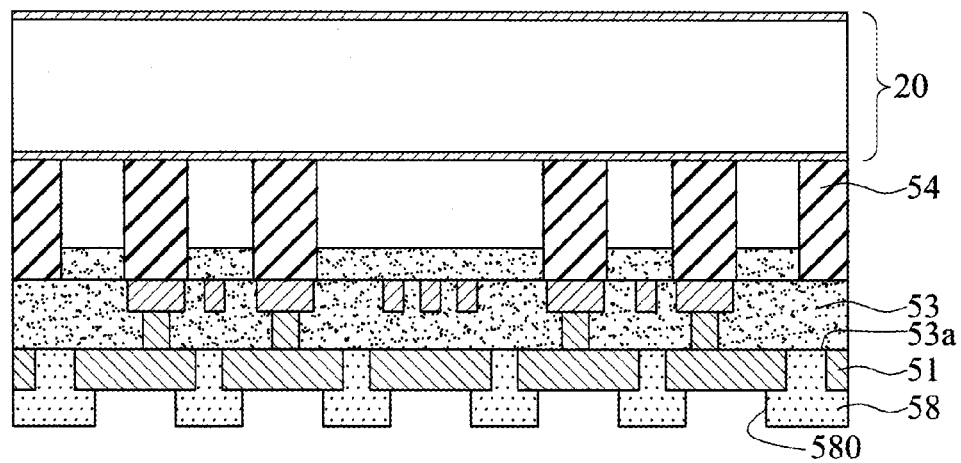
FIG. 5D'
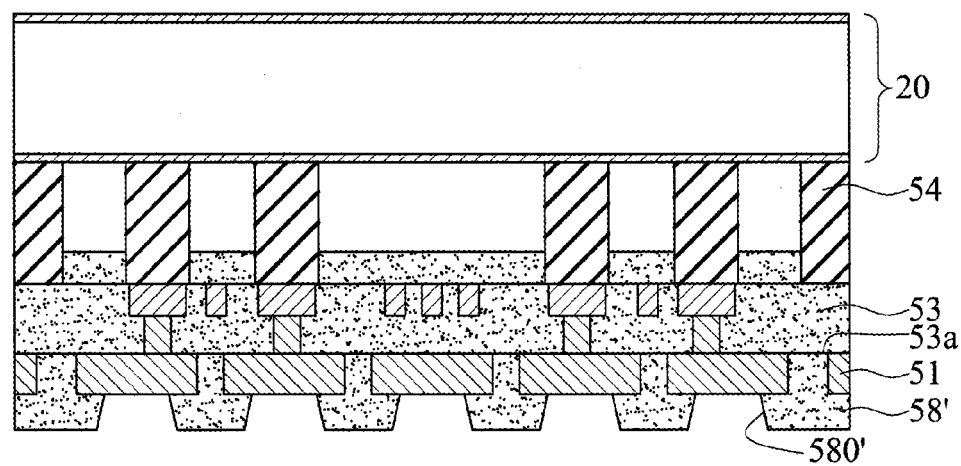
FIG. 5D"

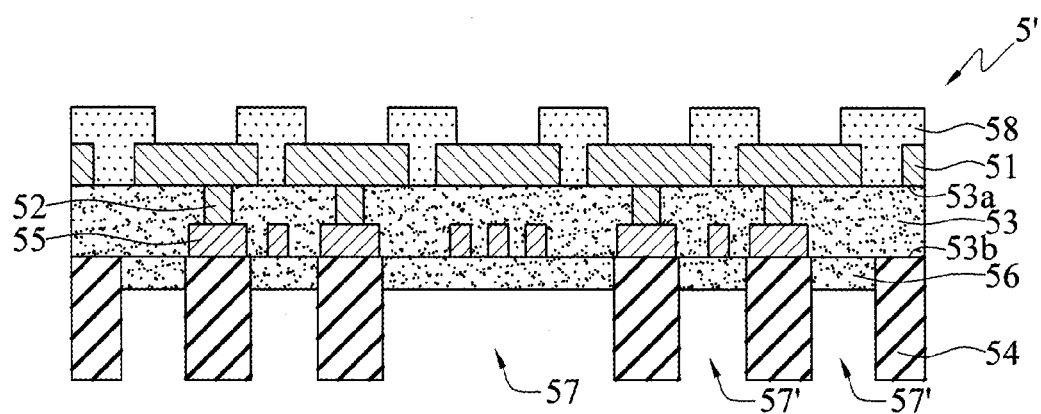
FIG. 5F'
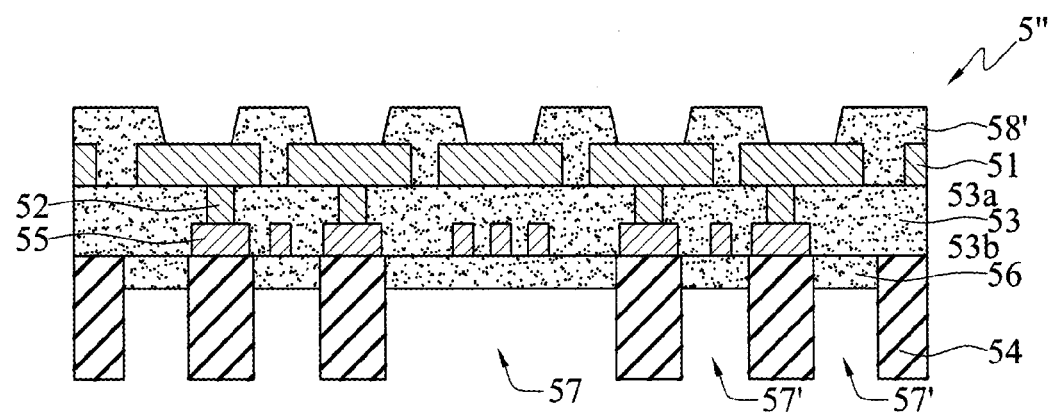
FIG. 5F"

INTERPOSER SUBSTRATE AND METHOD OF FABRICATING THE SAME

BACKGROUND OF THE INVENTION

1. Field of the Invention

The present invention relates to interposer substrates, and, more particularly, to an interposer substrate used in a package having a stack structure and a method of fabricating the interposer substrate.

2. Description of Related Art

With the advancement in semiconductor packaging technology, a semiconductor device may be packaged in a variety of manners, in order to increase electrical functionality and reduce packaging space. For instance, a Package on Package (PoP) is developed having multiple packaging structures, each being stacked on top of the other. This type of package having the property of heterogeneous integration of a System in Package (SiP), is capable of incorporating and integrating various electronic components of different functions, such as memory, central processing unit, graphic processor, image processor, etc., in a package through stacking techniques, thereby is very suitable to be used in various low-profile electronic products.

Early stacked packages are formed by stacking memory packages (memory IC) over the logic packages (logic IC) via a plurality of solder balls. As the demand for compact-size and low-profile electronic products, the density of wiring on the memory package increases. The memory package is measured in nanometers; the distance between the contacts are further shortened. However, the distances between the logic packages are measured in micrometers, and cannot be reduced any further to comply with the distances between the memory packages. As a result, even a memory package with high density wiring is provided, there is no suitable logic package to go in concert with the memory package, thereby unable to achieve efficient production of the electronic products.

Accordingly, in order to overcome the above mentioned drawbacks, an interposer substrate 10 is disposed between a memory package 11 and a logic package 12. As shown in FIG. 1, the bottom of the logic package 12 is coupled to the logic package 12 having logic chips of greater pitches, while the top of the interposer substrate 10 is coupled to a memory package having a memory chip 110 of less pitches.

However, since in the stacked package 1 a plurality of solder balls 13 are used as a supporting and electrical means, if I/O number is increasing and the package size remains the same, the distance between each of the solder balls 13 needs to be shortened, which may easily cause short circuit as a result of bridging, and subsequently causing low yield and unsatisfactory reliability.

Thus, copper pillars are developed to replace the solder balls. The copper pillars have the advantage that they can hardly become deformed during the reflow process, which keeps the same height between each of the copper pillars, thereby preventing the bridging problem, so as to increase the product yield.

FIGS. 1A-1D are cross-sectional views showing a method of fabricating a conventional interposer substrate 10.

As shown in FIG. 1A, a plurality of vias 100 are formed penetrating the board 10' such as a copper foil substrate.

As shown in FIG. 1B, two wiring layers 14 are formed on the two sides of the board 10, respectively, via copper foils 10a, and a plurality of conductive vias 15 are formed in the vias 100 and electrically connected with the wiring layer 14.

As shown in FIG. 1C, an insulative protection layer 16 is formed on the board 10' and the wiring layers 14, and a portion of the wiring layers 14 is exposed and functions as conductive pads 140.

As shown in FIG. 1D, copper pillars 17 are disposed on the conductive pads 140.

However, a higher cost is required for the complex method in making the conventional interposer substrate 10 (such as forming the vias 100). Moreover, conductive layers 170 are required to be formed additionally for the electroplating process for forming the copper pillars 17 (on one side or two sides according to practical needs). Therefore, after the excessive conductive layer 170 is removed, it is common to have residual conductive materials of the conductive layer 170 remained, which interferes the conductivity of the copper pillars 17 (for instance the remaining conductive layer 170 may connect with the adjacent copper pillars 17, which causing short circuit), causing the overall conductivity to be deteriorated.

Moreover, the thickness of the interposer substrate 10 needs to take consideration of the board 10' (that is the core layer) and may become limited (hard to be thinner). Hence, the thinner the thickness of the interposer substrate 10 is, the harder it is to be fabricated. Moreover, the problem such as damages to the board 10' will be encountered.

In addition, there will be limitation for design of the line width/line space (L/S) of the wiring layer 14. In general, the smallest L/S that can be fabricated is 12/12 µm, but the yield may be influenced when L/S is anywhere lower than 25/25 µm.

Hence, there is an urgent need to solve the foregoing problems encountered in the prior art.

SUMMARY OF THE INVENTION

In view of the foregoing drawbacks, the present invention provides an interposer substrate, comprising: a first insulating layer comprising opposing first and second surfaces; a first wiring layer formed on the first surface of the first insulating layer; a plurality of conductive pillars disposed in the first insulating layer and electrically connected with the first wiring layer; a second wiring layer formed on the second surface of the first insulating layer and electrically connected with the conductive pillars; a plurality of external connection pillars disposed on and electrically connected with the second wiring layer; and a second insulating layer formed on the second surface of the first insulating layer and the second wiring layer, surrounding a periphery of each of the external connection pillars and exposing the external connection pillars, and having at least a trench formed thereon for accommodating an electronic component.

In an embodiment, the second wiring layer is not exposed from a surface of the second insulating layer.

The present invention further provides a method of fabricating an interposer substrate, comprising: providing a carrier having a first wiring layer and a plurality of conductive pillars disposed on the first wiring layer; forming on the carrier with a first insulating layer that has a first surface coupled to the carrier and a second surface opposing the first surface, with the conductive pillars being exposed from the second surface of the first insulating layer; forming a second wiring layer on the second surface of the first insulating layer and the conductive pillars, and electrically connecting the second wiring layer to the conductive pillars; forming a plurality of external connection pillars on the second wiring layer and electrically connecting the external connection pillars to the second wiring layer; forming a second insulating layer on the second surface of the first insulating layer, the external connection pillars, and the second wiring layer, with the external connection pillars being exposed from the second insulating layer; forming at least a trench on the second insulating layer; and removing the carrier, with the first wiring layer being exposed from the first surface of the first insulating layer.

In an embodiment, the entire carrier is removed.

In an embodiment, the surface of the first wiring layer is lower than the first surface of the first insulating layer.

In an embodiment, the end surface of each of the conductive pillars is flush with the second surface of the first insulating layer.

In an embodiment, the second insulating layer is formed along the side surface of each of the external connection pillars.

In an embodiment, a portion of the carrier is retained after partially removed and functions as a supporting structure for the first surface of the first insulating layer.

The present invention further provides a method of fabricating an interposer substrate, comprising: providing a carrier having a plurality of external connection pillars and a second insulating layer among the external connection pillars; forming a second wiring layer on the second insulating layer and the external connection pillars, disposing a plurality of conductive pillars on the second wiring layer, and electrically connecting the second wiring layer to the conductive pillars; forming on the second insulating layer, the external connection pillars, the conductive pillars and the second wiring layer a first insulating layer that has a first surface and a second surface opposing the first surface and coupled to the second insulating layer; forming a first wiring layer on the first surface of the first insulating layer, and electrically connecting the second wiring layer by the conductive pillars; removing the carrier to expose the external connection pillars, and forming at least a trench on the second insulating layer.

In an embodiment, when the carrier is provided, a resist layer is formed among the external connection pillars, and the second insulating layer is formed on the resist layer. A trench is formed after the carrier and the resist layer are sequentially removed, to form the resist layer. A recessed portion is formed among the external connection pillars after the resist layer is removed.

In an embodiment, the end surface of the conductive pillars is flush with the first surface of the first insulating layer.

In an embodiment, the second wiring layer is embedded in the second surface of the first insulating layer.

In an embodiment, the method further comprises forming an insulating protection layer on the first wiring layer and the first surface of the first insulating layer, with a portion of a surface of the first wiring layer exposed from the insulating protection layer.

In an embodiment, the first insulating layer is formed by molding, coating, or lamination technique. The first insulating layer is made of a molding compound, a primer, or a dielectric material.

In an embodiment, the second insulating layer is made by molding, coating, or lamination technique. The second insulating layer is made of a molding compound, a primer, or a dielectric material.

In an embodiment, the method further comprises forming a recessed portion on the second insulating layer, wherein the recessed portion is formed among the external connection pillars, and the depth of the recessed portion is less than or equal to the depth of the trench.

Accordingly, the interposer substrate and the method of fabricating the same according to the present invention feature in forming a coreless interposer substrate on the carrier, such that the via process is omitted. Since the first insulating layer and second insulating layer are formed, there is no need to the formation of the conventional insulating protection layer. Therefore, the method is simplified, and the interposer substrate thus fabricated has a low cost.

Moreover, without the limitation of conventional board, the interposer substrate is easy to be fabricated without the concern of damages to the board, thereby facilitating the fabrication of finer and denser circuits.

BRIEF DESCRIPTION OF DRAWINGS

The present invention can be more fully understood by reading the following detailed description of the preferred embodiments, with reference made to the accompanying drawings, wherein:

FIGS. 5A-5F are cross-sectional views showing a method of fabricating an interposer substrate in accordance with a fourth embodiment of the present invention; wherein FIGS. 5D' and 5D" are another embodiments of FIG. 5D, and FIGS. 5F' and 5F" are another embodiments of FIG. 5F.

DETAILED DESCRIPTION OF PREFERRED EMBODIMENTS

The present invention is described in the following with specific embodiments, so that one skilled in the pertinent art can easily understand other advantages and effects of the present invention from the disclosure of the present invention.

It should be noted that all the drawings are not intended to limit the present invention. Various modification and variations can be made without departing from the spirit of the present invention. Further, terms, such as "upper", "first", "second" and "one" etc., are merely for illustrative purpose and should not be construed to limit the scope of the present invention.

FIGS. 2A-2F are cross-sectional view showing a method of fabricating a coreless interposer substrate 2 in accordance with a first embodiment of the present invention.

Figure 1:
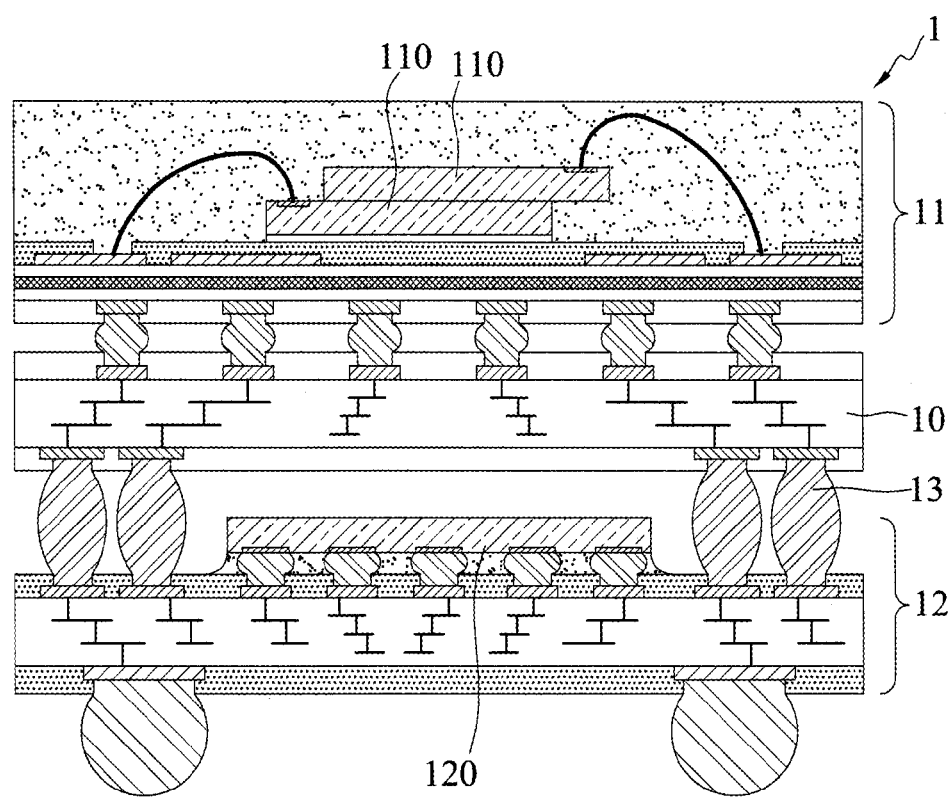
FIG. 1 is a schematic cross-sectional view of a conventional stacked package.
Figure 1A:
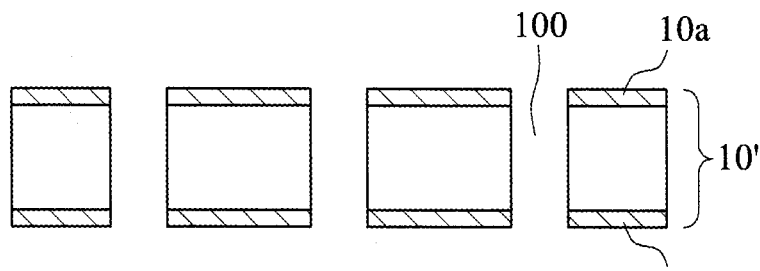
FIGS. 1A-1D are schematic cross-sectional views showing a method of fabricating a conventional interposer substrate.
Figure 1B:
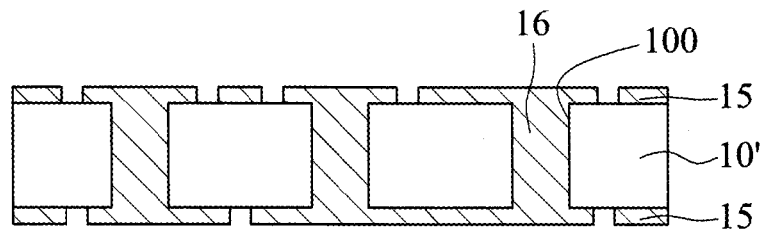
Figure 1C:
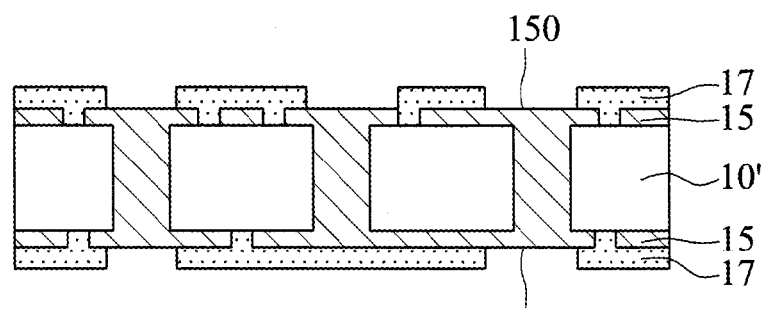
Figure 1D:
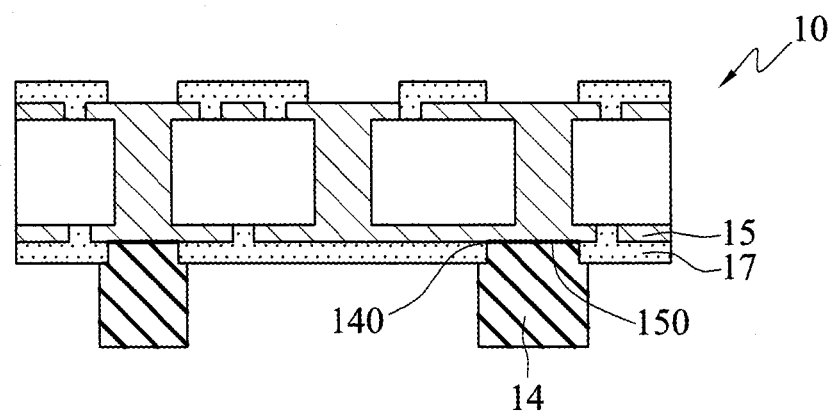
Figure 2A:
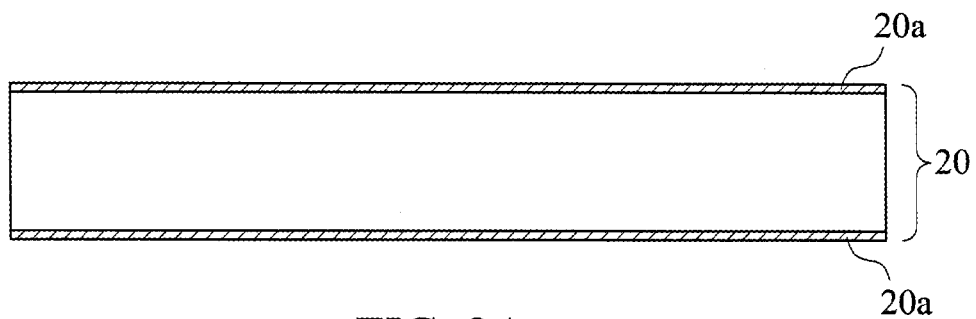
FIGS. 2A-2H are schematic cross-sectional views showing a method of fabricating an interposer substrate in accordance with a first embodiment of the present invention; wherein FIG. 2H' is another embodiment of FIG. 2H.

As shown in FIG. 2A, a carrier 20 is provided. In an embodiment, the carrier 20 is, but not limited to, a substrate, such as a copper foil substrate or a silicon containing board. The copper foil substrate is used to exemplify an embodiment. A metal material 20a is formed on two sides of the copper foil substrate 20.

Figure 2B:
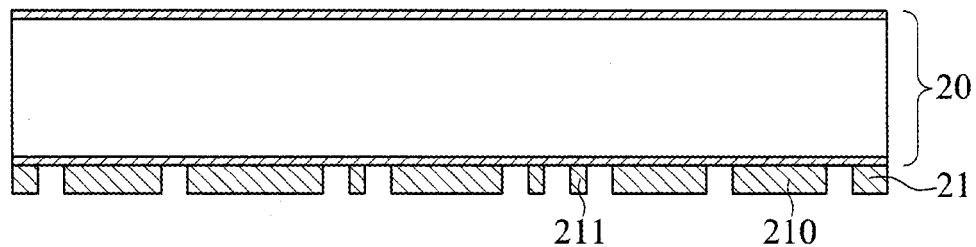

As shown in FIG. 2B, a first wiring layer 21 is formed on the carrier 20 through a patterning process.

In an embodiment, the first wiring layer 21 comprises a plurality of conductive pads 210 and a plurality of conductive traces 211.

Figure 2C:
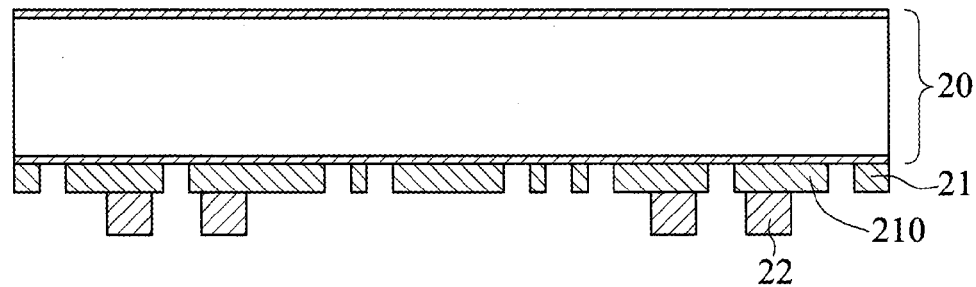

As shown in FIG. 2C, through a pattering process, a plurality of conductive pillars 22 are electro-platted on the conductive pads 210 of the first wiring layer 21.

Figure 2D:
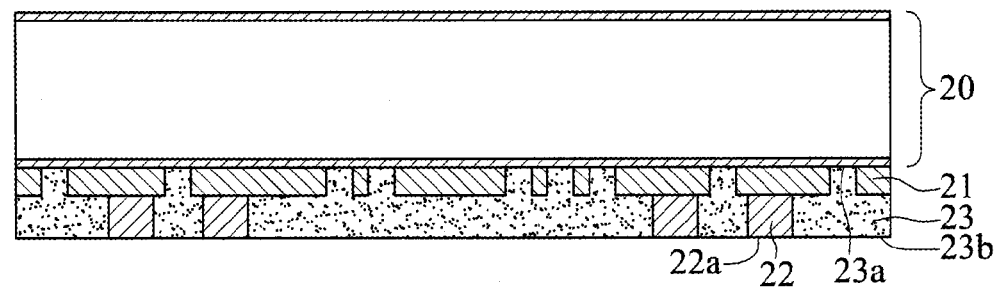

As shown in FIG. 2D, a first insulating layer 23 is formed on the carrier 20. The first insulating layer 23 has opposing first and second surfaces 23a and 23b. In an embodiment, the first surface 23a is opposite to the second surface 23b, and is not limited to a plane surface. The first surface 23a of the first insulating layer 23 is coupled to the carrier 20. The conductive pillars 22 are exposed from the second surface 23b of the first insulating layer 23.

In an embodiment, the first insulating layer 23 is formed on the carrier 20 by molding, coating or lamination technique. The first insulating layer 23 is made of a molding compound, a primer, or a dielectric material such as epoxy.

Through a grinding process, an end surface 22a of each of the conductive pillars 22 is flush with the second surface 23b of the first insulating layer 23.

Figure 2E:
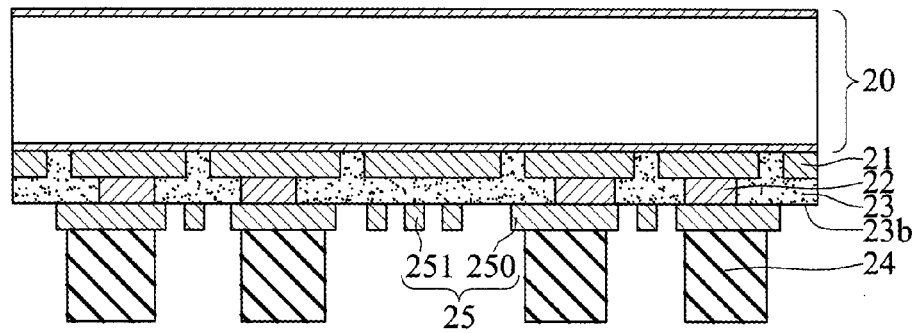

As shown in FIG. 2E, a second wiring layer 24 is formed on the second surface 23b of the first insulating layer 23 and the conductive pillars 22 by a patterning process. A plurality of external connection pillars 25 are disposed on the second wiring layer 24 and electrically connected with the second wiring layer 24 through an electro-plating process.

In an embodiment, the second wiring layer 24 has a plurality of conductive pads 240 and a plurality of conductive traces 241. The external connection pillars 25 are disposed on the conductive pads 240, and the second wiring layer 24 is electrically connected with the external connection pillars 25 and the conductive pillars 22.

The conductive pads 240 are at the positions corresponding to the conductive pillars 22. In another embodiment, the positions of the conductive pads 240 do not correspond to the positions of the conductive pillars 22.

The external connection pillars 25 are copper pillars.

Figure 2F:
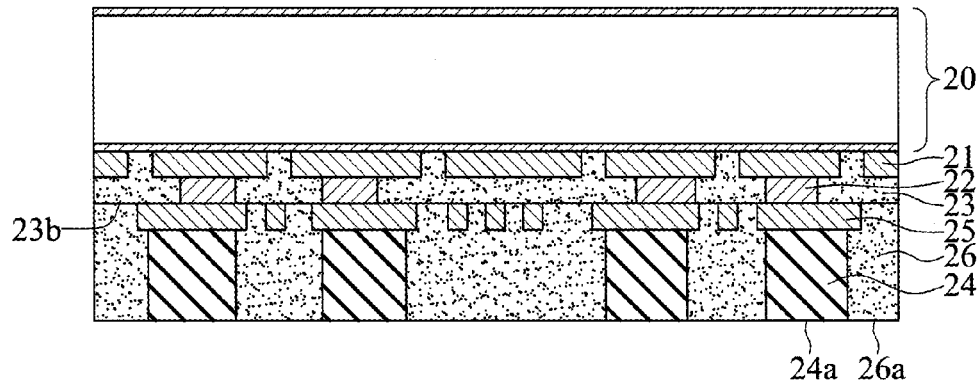

As shown in FIG. 2F, a second insulating layer 26 is formed on the second surface 23b of the first insulating layer 23, the external connection pillars 25 and the second wiring layer 24, the external connection pillars 25 are exposed from the second insulating layer 26, and the second wiring layer 24 is not exposed from the second insulating layer 26.

In an embodiment, through the grinding process, the surface 26a of the second insulating layer 26 is flush with the end surface 25a of each of the external connection pillars 25.

In an embodiment, the second insulating layer 26 is formed by molding, coating or lamination technique, and the second insulating layer 26 is made of a molding compound, a primer, or a dielectric material such as epoxy.

Figure 2G:
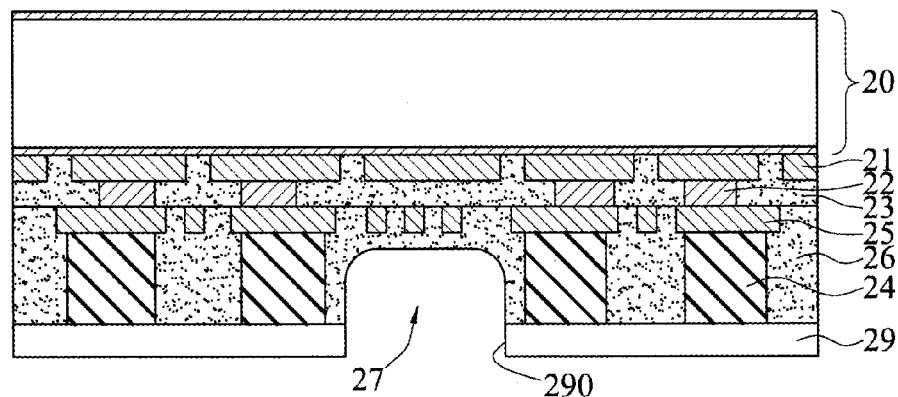

As shown in FIG. 2G, the second insulating layer 26 is etched to form a trench 27, for a semiconductor component to be accommodated therein, and the second wiring layer 24 is not exposed from the second insulating layer 26.

In an embodiment, a predetermined etching position 290 is defined by a resist layer 29 (such as a photoresist material or a metal material). The second insulating layer 26 is etched by using physical or chemical etching technique for forming the trench 27, and the resist layer 29 is then removed. The external connection pillars that are tall and even can thus be fabricated, and can be connected with contacts of another component in a packaging process, with the trench 27 used as positioning component.

The second insulating layer 26 surrounds a periphery of each of the external connection pillars 25.

Figure 2H:
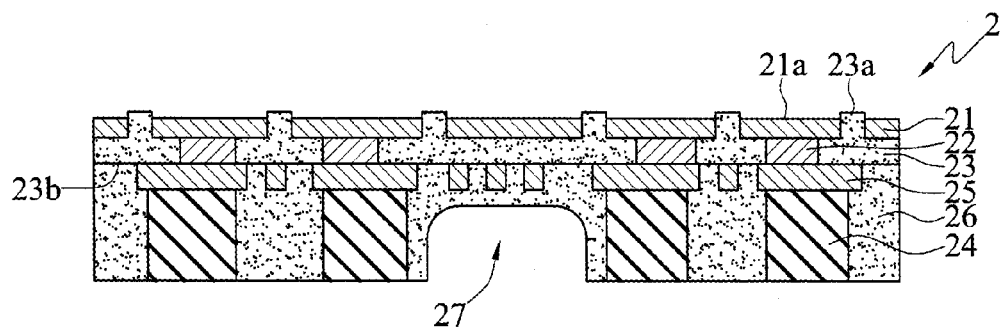
Figure 2H:
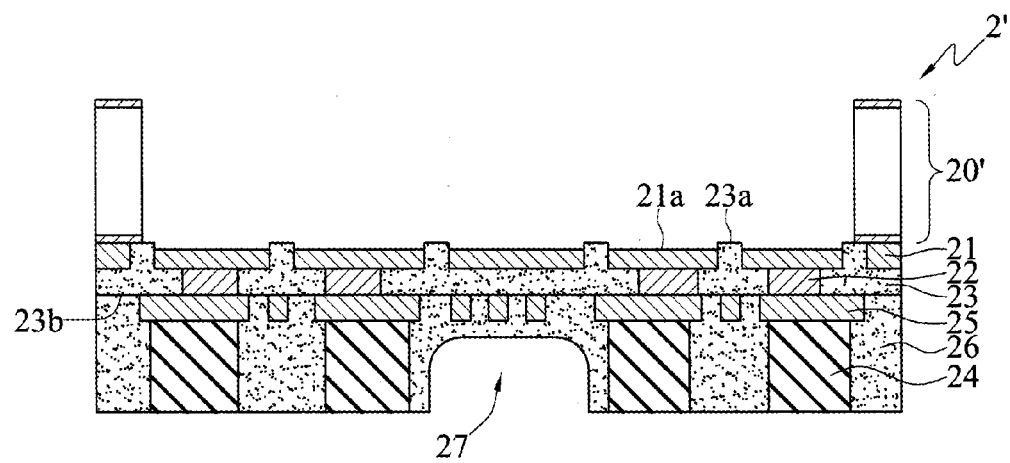

As shown in FIG. 2H, the entire carrier 20 is removed, and the surface 21a of the first wiring layer 21 is exposed from and lower than the first surface 23a of the first insulating layer 23.

In an embodiment, the metal material 20a is etched, and a top surface 21a of the wiring layer 21 is also etched slightly and slightly recessed than the first surface 23a of the insulating layer 23.

As shown in FIG. 2H', a portion of the carrier 20 is etched, a remaining portion of the carrier 20 functions as a supporting structure 20', and the surface 21a of the first wiring layer 21 is exposed from the first surface 23a of the first insulating layer 23.

In an embodiment, the interposer substrates 2 and 2' have a coreless type of circuit design, such that the formation of vias can be omitted. Through the formation of the first insulating layer 23 and the second insulating layer 26, the formation of an insulating protection layer is also omitted. Therefore, the method is simplified, and the interposer substrates 2 and 2' thus fabricated have a low cost.

As compared with the conventional interposer substrate, the interposer substrates 2 and 2' according to the present invention, which are not limited by the board, can solve the problem that the board is damaged. Besides, circuits having finer pitches and high density can be fabricated on the interposer substrate 2 and 2'.

If the carrier 20 has the metal material 20a, the metal material 20a may function as a conductive layer, and it is possible to form the external connection pillars using an electro-plating method without the need of additionally forming a conductive layer, and thus the problem of conductivity of the external connection pillars 25 as a result of remaining conductive layer, thereby enhancing the overall conductivity of the interposer substrates 2 and 2'.

Figure 2I:
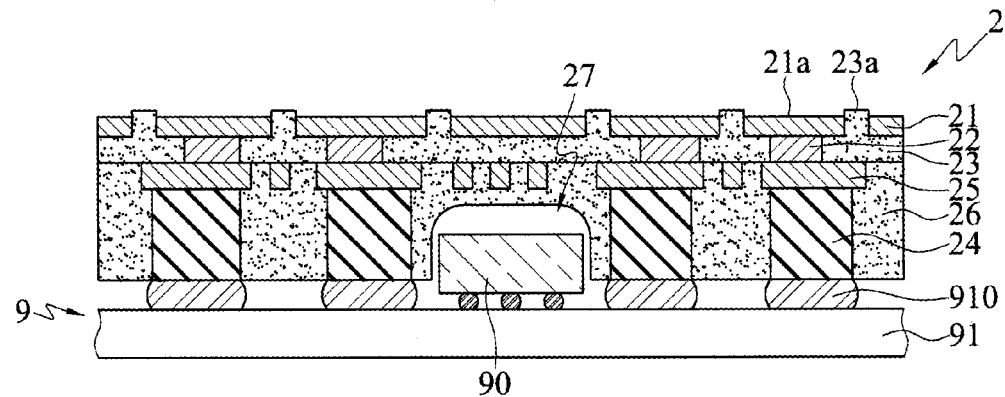
FIG. 2I is a schematic view of a subsequent process of FIG. 2H.

In subsequent processes, as shown in FIG. 2I, the interposer substrate 2 may be stacked by a package 9 having an electronic component 90 such as a chip, the electronic component 90 is accommodated in the trench 27, and the external connection pillars 25 are connected to the contacts 910 (such as a solder balls) of the substrate 91 of the package 9. The substrate 91 is used to carry the electronic component 90. It should be noted that the type of the package 9 is not limited to those shown in the drawings.

Figure 3A:
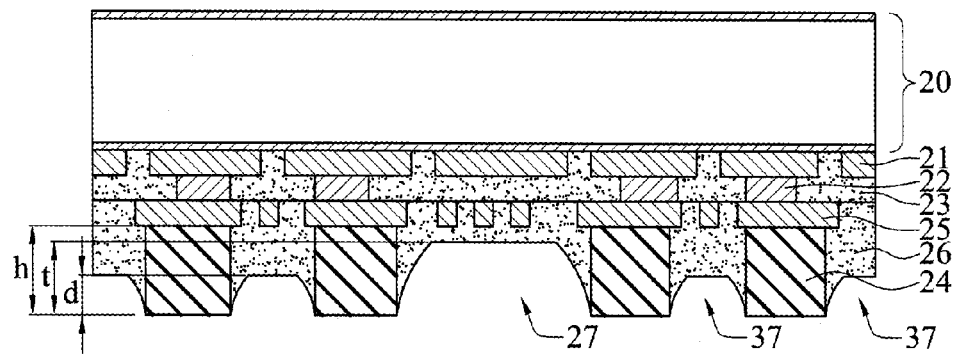
FIGS. 3A-3B are cross-sectional views showing a method of fabricating an interposer substrate in accordance with a second embodiment of the present invention; wherein FIG. 3B' is another embodiment of FIG. 3B.
Figure 3B:
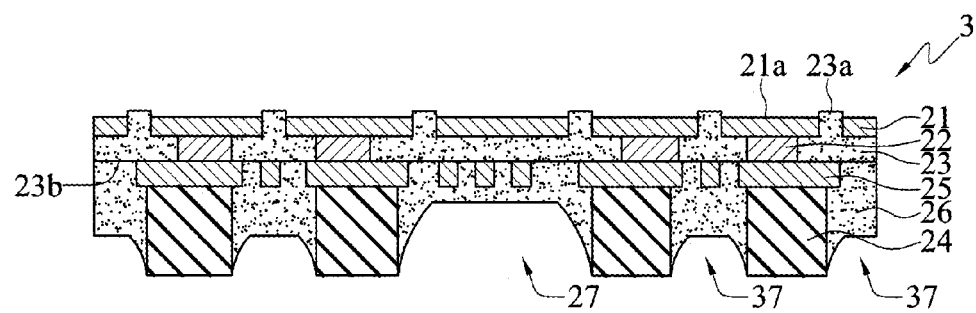
Figure 3B:
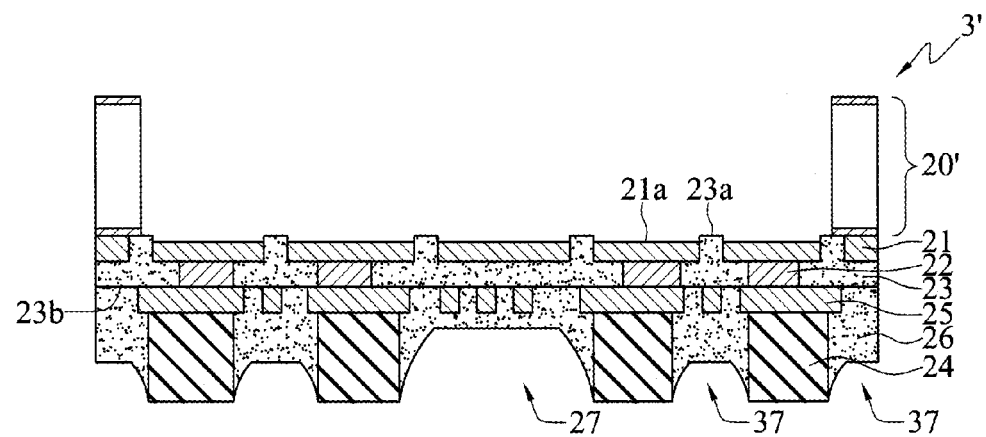

FIGS. 3A-3B are cross-sectional views showing a method of fabricating an interposer substrate in accordance with a second embodiment of the present invention; wherein FIG. 3B' is another embodiment of FIG. 3B;

As shown in FIG. 3A, in the fabricating process of FIG. 2G a plurality of recessed portions 37 are formed in the second insulating layer 26, the recessed portions 37 are among the external connection pillars 25, and the second insulating layer 26 is formed along the side surface of each of the external connection pillars 25.

In an embodiment, the depth d of each of the recessed portions 37 is less than the depth t of the trench 27. In another embodiment, the depth d of each of the recessed portions 37 is about a half of the height of the external connection pillars 25. However, the ratio of the depth d of each of the recessed portions 37 to the height h of each of the external connection pillars 25 can be modified according to practical needs. In an embodiment, the ratio is 1/3, 1/4 etc.

In an embodiment, predetermined etching positions are formed through forming the resist layer 29 (such as photoresist or metal materials), followed by forming the trench 27 by etching the second insulating layer 26 using a physical or chemical etching method. During the etching process, both the photoresist material and the second insulating layer 26 (i.e., the trench) are etched at the same time. When the resist layer is completely etched, the plane surface of the second insulating layer 26 (i.e., the trench 27 and the recessed portions 37) is started to be etched, to form the trench 27 and the recessed portions 37 having unequal height, allowing the second insulating layer 26 to be step-like.

As shown in FIG. 3B, after the entire carrier 20 is removed, the first wiring layer 21 is exposed from the first surface 23a of the first insulating layer 23.

As shown in FIG. 3B', a patterning process is performed to etch a portion of the carrier 20, allowing the remaining portion of the carrier 20 to function as a supporting structure 20', such that the first wiring layer 21 is exposed from the first surface 23a of the first insulating layer 23.

Through the design of the recessed portions 37, the external connection pillars 25 have more obvious shapes, so as to facilitate precise connection between the external connection pillars 25 and the contacts of other components in the subsequent packaging processes.

Figure 4A:
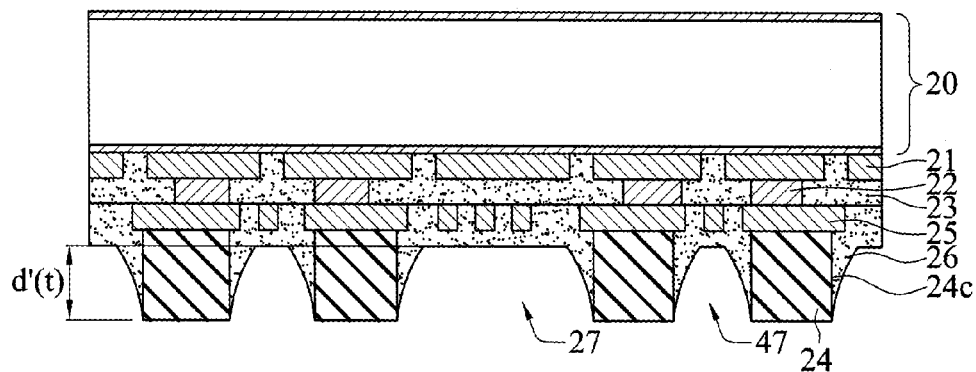
FIGS. 4A-4B are cross-sectional views showing a method of fabricating an interposer substrate in accordance with a third embodiment of the present invention; wherein FIG. 4B' is another embodiment of FIG. 4B.
Figure 4B:
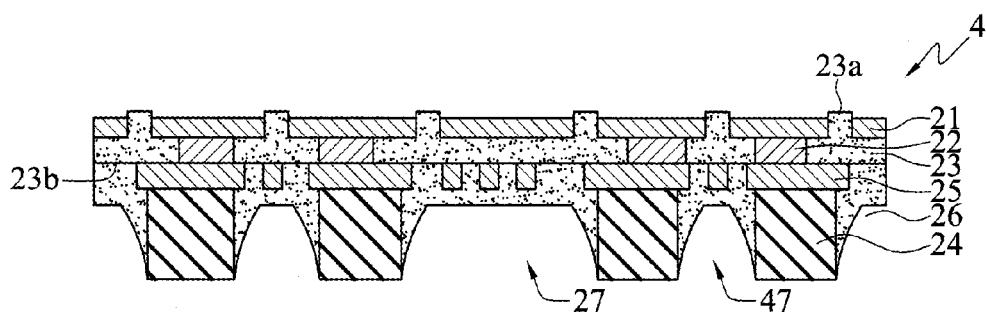
Figure 4B:
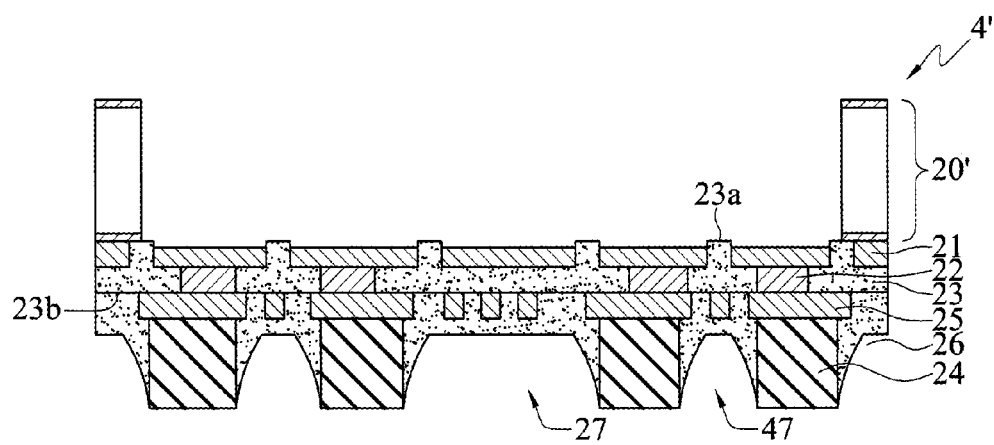

FIGS. 4A-4B are cross-sectional views showing a method of fabricating an interposer substrate in accordance with a third embodiment of the present invention. The third embodiment differs from the second embodiment in the change in the recessed portions.

As shown in FIG. 4A, during the fabricating process of FIG. 2G a plurality of recessed portions 47 are formed on the second insulating layer 26, allowing the second insulating layer 26 to be formed along the side surface 25c of each of the external connection pillars. Therefore, the side surface 25c of each of the external connection pillars 25 is not exposed, and the depth d' of each of the recessed portions 47 equals to the depth t of the trench 27.

In an embodiment, the second insulating layer 26 is directly etched by physical or chemical etching technique, to form the trench 27 and the recessed portions 47 having the same depth.

As shown in FIG. 4B, the entire carrier 20 is removed, allowing the first wiring layer 21 to be exposed from the first surface 23a of the first insulating layer 23.

As shown in FIG. 4B', a patterning process is performed to etch a portion of the carrier 20, allowing the remaining portion of the carrier 20 to function as a supporting structure 20', and the first wiring layer 21 is exposed from the first surface 23a of the first insulating layer 23.

FIGS. 5A-5F are cross-sectional views showing a method of fabricating an interposer substrate in accordance with a fourth embodiment of the present invention. The fifth embodiment differs from the first embodiment in the order for making the conductive elements.

Figure 5A:
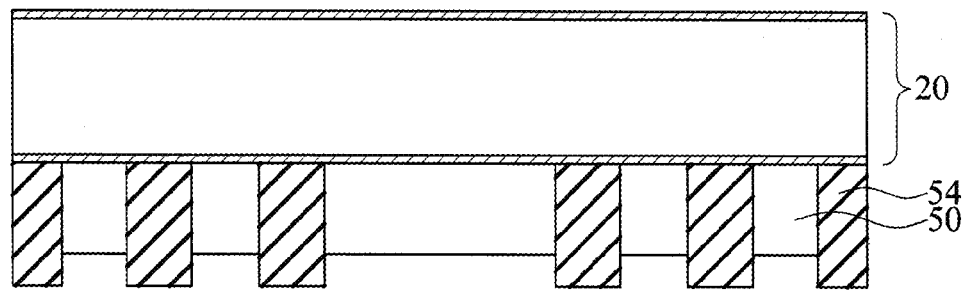

As shown in FIG. 5A, a plurality of external connection pillars 55 are disposed on a carrier 20 through patterning the resist layer 50.

In an embodiment, the carrier 20 is a substrate, such as a copper foil substrate or silicon containing board. The copper foil substrate is used to exemplify an embodiment, and a metal material 20a is formed on two sides of the copper foil substrate.

The resist layer 50 is patterned through an exposure and development method, and the external connection pillars 55 are electro-plated copper pillars.

Further, the external connection pillars 55 protrude the surface of the resist layer 50. The resist layer 50 is formed on the carrier 20 through a patterning process, and after an electro-plating process, the external connection pillars 55 are formed, followed by removing a portion of the resist layer 50, to allow the surface of the resist layer 50 to be lower than the end surface of the external connection pillars 55.

Figure 5B:
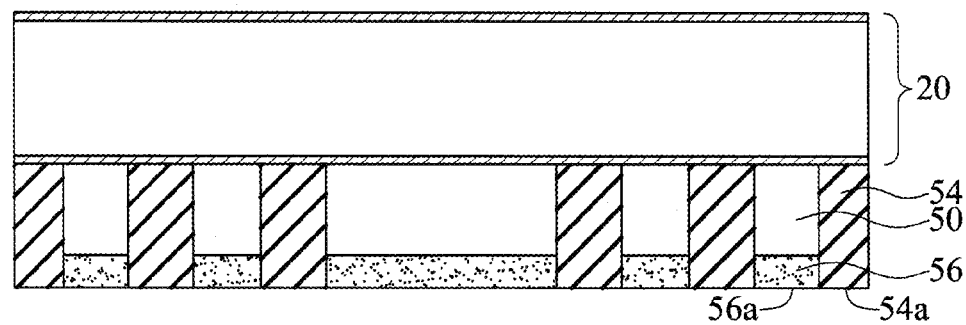

As shown in FIG. 5B, a second insulating layer 56 is formed on the resist layer 50, allowing a second insulating layer 56 to be formed among the external connection pillars 55.

In an embodiment, the second insulating layer 56 is formed by molding, coating or lamination technique. The first insulating layer is made of a molding compound, a primer, or a dielectric material.

Furthermore, through the grinding process, the surface 56a of the second insulating layer 56 is flush with the end surfaces 55a of the external connection pillars 55.

Figure 5C:
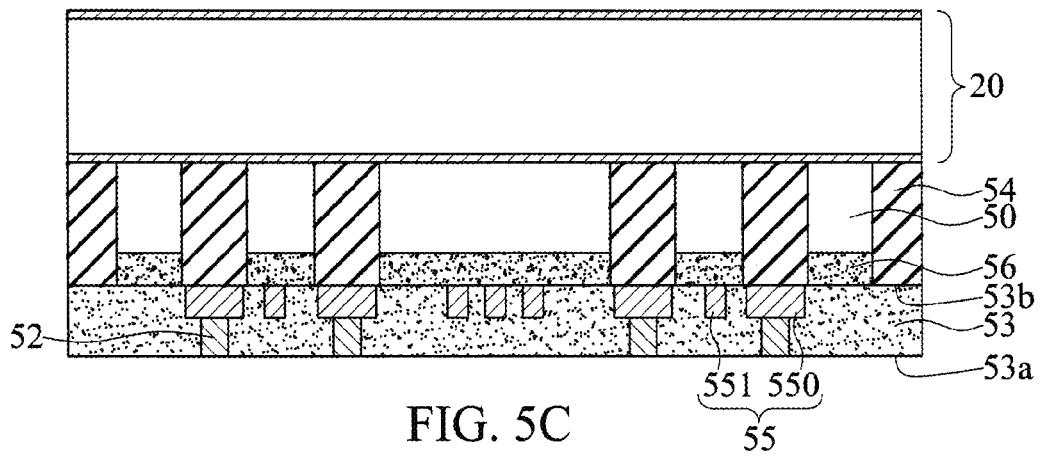

As shown in FIG. 5C, a second wiring layer 54 is formed on the second insulating layer 56 and the external connection pillars 55, and a plurality of conductive pillars 52 are disposed on the second wiring layer 54. The first insulating layer 53 is then formed on the second insulating layer 56, the external connection pillars 55 and the second wiring layer 54. The first insulating layer 53 has opposing first and second surfaces 53 and 53b, and the second surface 53b of the first insulating layer 53 is coupled to the second insulating layer 56 and the external connection pillars 55.

In an embodiment, the second wiring layer 54 has a plurality of conductive pads 540 and a plurality of conductive traces 541. The conductive pads 540 are disposed on the external connection pillars 55 and the second wiring layer 54, and are electrically connected with the external connection pillars 55.

The first insulating layer 53 is formed by molding, coating or lamination technique. The first insulating layer is made of a molding compound, a primer, or a dielectric material.

As shown in FIG. 5D, a first wiring layer 51 is formed on the first surface 53a of the first insulating layer 53, and the conductive pillars 52 are electrically connected with the first wiring layer 51 and second wiring layer 54.

In an embodiment, the first wiring layer 51 is formed with a plurality of conductive pads and shorter copper pillars, as compared with the external connection pillars 55.

The end surface 52a of each of the conductive pillars 52 is flush with the first surface 53a of the first insulating layer 53.

As shown in FIGS. 5D' and 5D", an insulating protection layer 58, 58' is formed on the first wiring layer 51 and the first surface 53a of the first insulating layer 53, and has a plurality of openings 580, 580', and a portion of the surface of the first wiring layer 51 is exposed from the openings 580, 580'. The insulating protection layer 58 of FIG. 5D' is made of a solder mask material such as green pain, and the insulating protection layer 58' of FIG. 5D" is made of a molding compound, a primer, or a dielectric material such as epoxy.

Figure 5E:
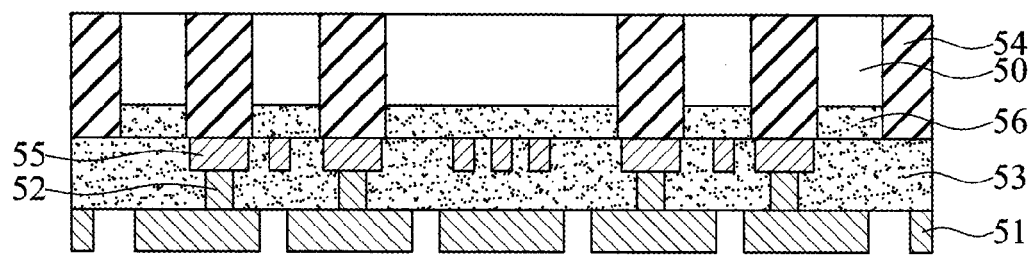

As shown in FIG. 5E, following the process of FIG. 5D, the entire carrier 20 is removed to expose the external connection pillars 55.

Figure 5F:
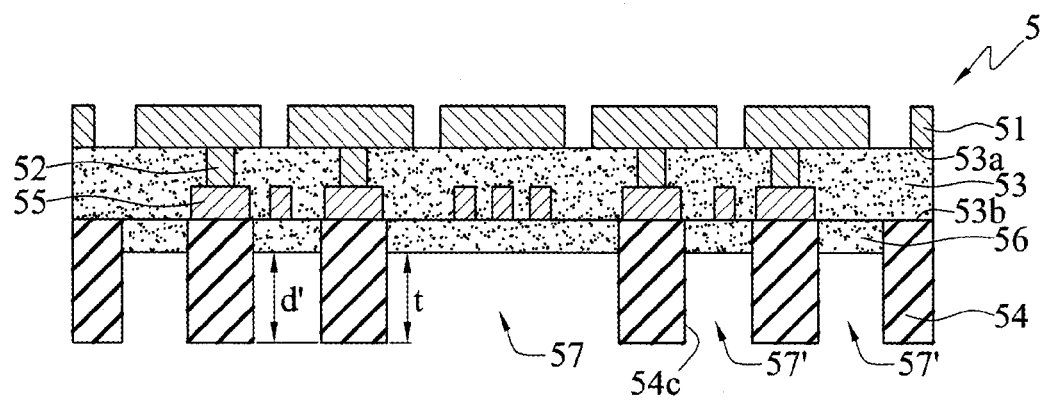

As shown in FIG. 5F, the resist layer 50 is removed, to form a trench 57 and a plurality of recessed portions 57' on the second insulating layer 56, and the second wiring layer 54 is not exposed from the second insulating layer 56.

In an embodiment, the recessed portions 57' are formed among the external connection pillars 55, and the depth d' of each of the recessed portions 57' equals to the depth t of the trench 57.

The second insulating layer 56 is not formed along the side surface 55c of each of the external connection pillars 55, and the side surface 55c of each of the external connection pillars 55 is exposed.

FIG. 5F' shows that the interposer substrate 5' is formed after the fabricating process of FIG. 5D'.

In an embodiment, the external connection pillars 55 are fabricated by forming a resist layer 50, molding a dielectric material thereon (such as a second insulating layer 56), followed by a buildup process (such as forming second wiring layer 54, first insulating layer 53, conductive pillars 52 and first wiring layer 51), and lastly the removing resist layer 50.

The present invention provides an interposer substrate 2, 2', 3, 3', 4, 4', 5, 5', 5'', comprising: a first insulating layer 23, 53, a first wiring layer 21, 51, a plurality of conductive pillars 22, 52, a second wiring layer 24, 54, a plurality of external connection pillars 25, 55, and a second insulating layer 26, 56.

The first insulating layer 23, 53 has opposing first surface 23a, 53a and second surface 23b, 53b. The first insulating layer 23, 53 is made of a molding compound, a primer, or a dielectric material.

The first wiring layer 21, 51 is formed on the first surface 23a, 53a of the first insulating layer 23, 53. In an embodiment, the first wiring layer 21 is embedded in the first surface 23a of the first insulating layer 23, and a surface 21a of the first wiring layer 21 is lower than the first surface 23a of the first insulating layer 23.

The conductive pillars 22, 52 are disposed in the first insulating layer 23, 53 and electrically connected with the first wiring layer 21, 51.

The second wiring layer 24, 54 is formed on the second surface 23, 53 of the first insulating layer 23, 53 and electrically connected with the conductive pillars 22, 52. In an embodiment, the second wiring layer 54 is embedded in the second surface 53b of the first insulating layer 53.

The external connection pillars 25, 55 are disposed on the second wiring layer 24, 54 and electrically connected with the second wiring layer 24, 54.

The second insulating layer 26, 56 is formed on the second surface 23b, 53b of the first insulating layer 23, 53 and the second wiring layer 24, 54, for surrounding the periphery of each of the external connection pillars 25, 55, and exposing the external connection pillars 25, 55, wherein the second insulating layer 26, 56 is further formed with at least a trench 27, 57 to accommodate the electronic component 90.

In an embodiment, the end surface 22a of the conductive pillars 22 is flush with the second surface 23b of the first insulating layer 23. In another embodiment, the end surfaces 52a of each of the conductive pillars 52 is flush with the first surface 53a of the first insulating layer 53.

In an embodiment, the second wiring layer 24, 54 is not exposed from the surface of the second insulating layer 26, 56.

In an embodiment, the second insulating layer 26, 56 is made of a molding compound, a primer, or a dielectric material.

In an embodiment, the second insulating layer 26, 56 is further formed with a plurality of recessed portions 37, 47, 57', and the recessed portions 37, 47, 57' are formed among the external connection pillars 25, 55. The depth d of each of the recessed portions 37 is less than the depth t of the trench 27, or the depth d' of each of the recessed portions 47, 57' equals to the depth t of the trench 27, 57.

In an embodiment, the second insulating layer 26 is formed along the side surface 25c of each of the external connection pillars 25.

In an embodiment, the interposer substrate 5', 5'' further comprises an insulating protection layer 58, 58' formed on the first surface 53a of the first insulating layer 53 and the first wiring layer 51, allowing a portion of the surface of the first wiring layer 51 to be exposed from the insulating protection layer 58, 58'.

In an embodiment, the interposer substrate 2', 3', 4' further comprises a supporting structure 20' formed on the first surface 23a of the first insulating layer 23.

In summary, the interposer substrate and the method of fabricating the same according to the present invention are widely used in stacked packages having fine pitches and high pin counts, and particularly is suitable when miniaturization, high functionality, high speed, and high memory are needed.

Moreover, in the interposer substrate according to the present invention, the external connection pillars and/or the first wiring layer can be used to connect to a logic package or memory package.

The present invention has been described using exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An interposer substrate, comprising:
   a first insulating layer having opposing first and second surfaces;
   a first wiring layer formed on the first surface of the first insulating layer;
   a plurality of conductive pillars disposed in the first insulating layer and electrically connected with the first wiring layer;
   a second wiring layer formed on the second surface of the first insulating layer and electrically connected with the conductive pillars;
   a plurality of external connection pillars disposed on and electrically connected with the second wiring layer; and
   a second insulating layer formed on the second surface of the first insulating layer and the second wiring layer, surrounding a periphery of each of the external connection pillars and exposing the external connection pillars, and having at least a trench formed thereon for accommodating an electronic component.

2. The interposer substrate of claim 1, wherein the first insulating layer is made of a molding compound, a primer, or a dielectric material.

3. The interposer substrate of claim 1, wherein the first wiring layer has a surface lower than the first surface of the first insulating layer.

4. The interposer substrate of claim 1, wherein each of the conductive pillars has an end surface flush with the first surface of the first insulating layer.

5. The interposer substrate of claim 1, wherein each of the conductive pillars has an end surface flush with the second surface of the first insulating layer.

6. The interposer substrate of claim 1, wherein the second wiring layer is embedded in the second surface of the first insulating layer.

7. The interposer substrate of claim 1, wherein the second wiring layer is free from being not exposed from a surface of the second insulating layer.

8. The interposer substrate of claim 1, wherein the second insulating layer is made of a molding compound, a primer, or a dielectric material.

9. The interposer substrate of claim 1, further comprising a plurality of recessed portions formed on the second insulating layer and among the external connection pillars.

10. The interposer substrate of claim 9, wherein each of the recessed portions has a depth less than or equal to a depth of the at least a trench.

11. The interposer substrate of claim 1, wherein the second insulating layer is formed along a side surface of each of the external connection pillars.

12. The interposer substrate of claim 1, further comprising an insulating protection layer formed on the first surface of the first insulating layer and the first wiring layer, wherein a portion of a surface of the first wiring layer is exposed from the insulating protection layer.

13. The interposer substrate of claim 1, further comprising a supporting structure disposed on the first surface of the first insulating layer.

* * * * *